United States Patent
Inagawa et al.

(10) Patent No.: US 8,961,756 B2
(45) Date of Patent: Feb. 24, 2015

(54) GANGED SCANNING OF MULTIPLE MAGNETRONS, ESPECIALLY TWO LEVEL FOLDED MAGNETRONS

(75) Inventors: Makoto Inagawa, Palo Alto, CA (US); Hien Minh Huu Le, San Jose, CA (US); Akihiro Hosokawa, Cupertino, CA (US); Bradley O. Stimson, Monte Sereno, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1420 days.

(21) Appl. No.: 11/780,757

(22) Filed: Jul. 20, 2007

(65) Prior Publication Data

US 2008/0029387 A1 Feb. 7, 2008

Related U.S. Application Data

(60) Provisional application No. 60/835,671, filed on Aug. 4, 2006, provisional application No. 60/835,681, filed on Aug. 4, 2006.

(51) Int. Cl.
  *C23C 14/35* (2006.01)
  *H01J 37/34* (2006.01)
(52) U.S. Cl.
  CPC ......... *H01J 37/3408* (2013.01); *H01J 37/3455* (2013.01)
  USPC .............. 204/298.19; 204/298.06; 204/298.2; 204/298.17
(58) Field of Classification Search
  USPC ................ 204/298.06, 298.19, 298.2, 298.17
  See application file for complete search history.

(56) References Cited

U.S. PATENT DOCUMENTS

| | | | | |
|---|---|---|---|---|
| 4,415,427 A | * | 11/1983 | Hidler et al. | 204/298.26 |
| 4,600,492 A | * | 7/1986 | Ooshio et al. | 204/298.2 |
| 5,407,551 A | * | 4/1995 | Sieck et al. | 204/298.19 |
| 5,458,759 A | * | 10/1995 | Hosokawa et al. | 204/298.2 |
| 5,565,071 A | | 10/1996 | Demaray et al. | |
| 5,855,744 A | | 1/1999 | Halsey et al. | |
| 5,876,574 A | * | 3/1999 | Hofmann et al. | 204/192.13 |
| 6,494,999 B1 | * | 12/2002 | Herrera et al. | 204/192.12 |
| 2005/0103620 A1 | * | 5/2005 | Chistyakov | 204/192.12 |
| 2005/0145478 A1 | * | 7/2005 | Tepman | 204/192.12 |
| 2006/0049040 A1 | | 3/2006 | Tepman | |
| 2007/0012562 A1 | | 1/2007 | Le et al. | |

FOREIGN PATENT DOCUMENTS

| | | | |
|---|---|---|---|
| JP | 59020469 A | * | 2/1984 |
| JP | 61204371 A | | 9/1986 |

* cited by examiner

*Primary Examiner* — Jason M Berman
(74) *Attorney, Agent, or Firm* — Charles S. Guenzer

(57) ABSTRACT

A magnetron assembly including one or more magnetrons each forming a closed plasma loop on the sputtering face of the target. The target may include multiple strip targets on which respective strip magnetrons roll and are partially supported on a common support plate through a spring mechanism. The strip magnetron may be a two-level folded magnetron in which each magnetron forms a folded plasma loop extending between lateral sides of the strip target and its ends meet in the middle of the target. The magnets forming the magnetron may be arranged in a pattern having generally uniform straight portions joined by curved portion in which extra magnet positions are available near the corners to steer the plasma track. Multiple magnetrons, possibly flexible, may be resiliently supported on a scanned support plate and individually partially supported by rollers on the back of one or more targets.

14 Claims, 12 Drawing Sheets

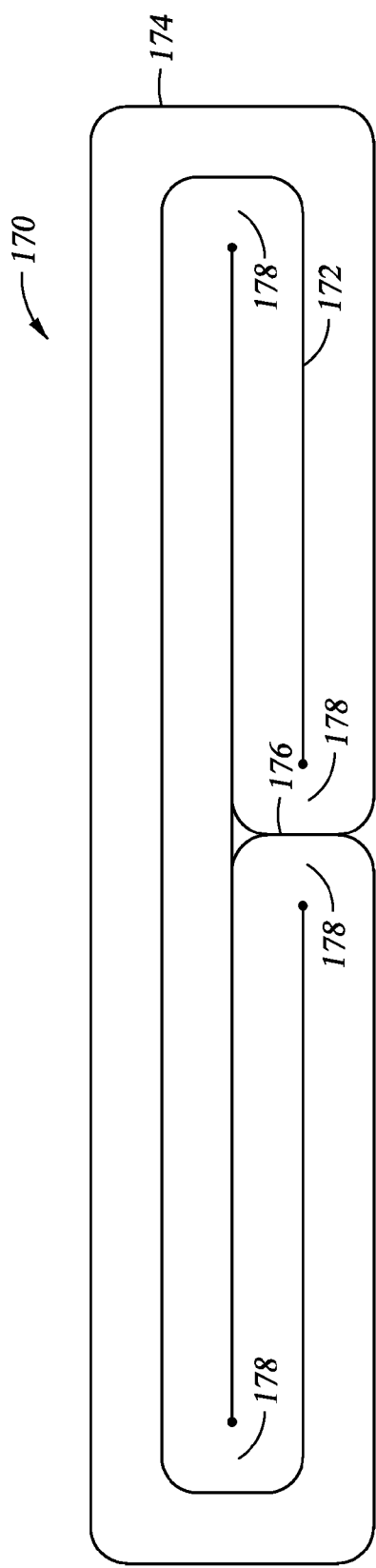
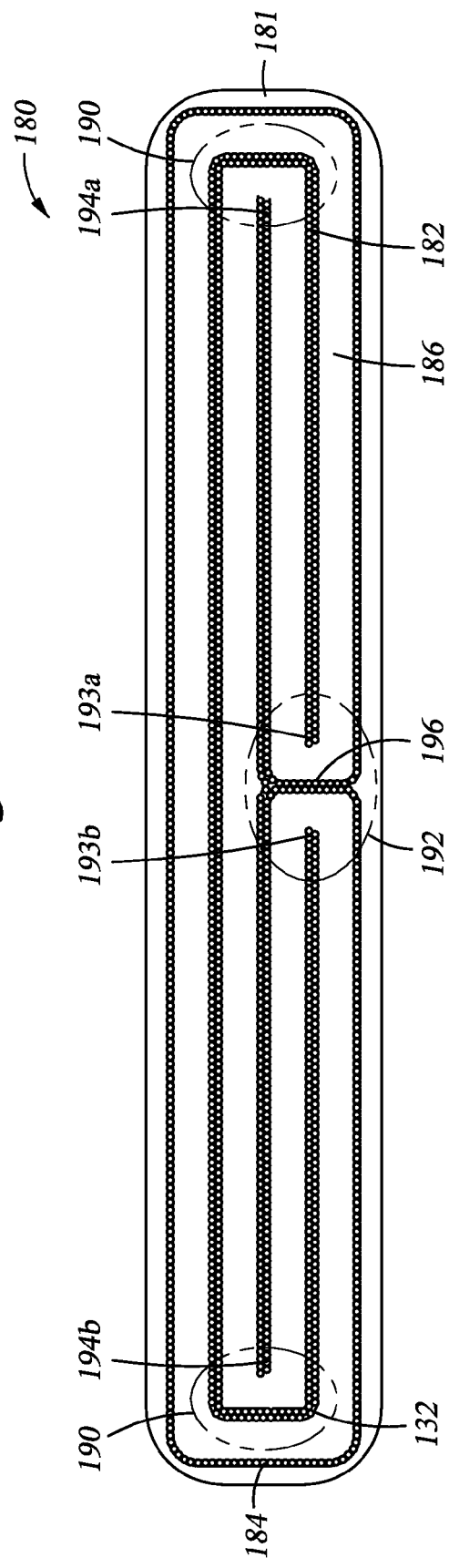
Fig. 7
Fig. 8

GANGED SCANNING OF MULTIPLE MAGNETRONS, ESPECIALLY TWO LEVEL FOLDED MAGNETRONS

RELATED APPLICATIONS

This application claims benefit of provisional application 60/835,671 and 60/835,681, both filed Aug. 4, 2006, both incorporated herein by reference. This application is also related to Ser. No. 11/601,576, filed Nov. 17, 2006.

FIELD OF THE INVENTION

The invention relates generally to sputter deposition in the fabrication of semiconductor integrated circuits. In particular, the invention relates to magnetrons scanned over the back of a plasma sputtering target.

BACKGROUND ART

Plasma magnetron sputtering has been long practiced in the fabrication of silicon integrated circuits. More recently, sputtering has been applied to depositing layers of materials onto large, generally discrete rectangular panels of glass, metal, or polymer or onto equivalent sheets. The completed panel may incorporate thin-film transistors, plasma display, field emitter, liquid crystal display (LCD) elements, or organic light emitting diodes (OLEDs) and is typically directed to flat panel displays. Photovoltaic cells may similarly be fabricated. Related technology may be used for coating glass windows with optical layers. The material of the sputter deposited layer may be a metal, such as aluminum or molybdenum, transparent conductors, such as indium tin oxide (ITO), and yet other materials including silicon, metal nitrides and oxides.

Demaray et al. describe such a flat panel sputter chamber in U.S. Pat. No. 5,565,071, incorporated herein by reference in its entirety. Their sputter chamber 10 includes, as illustrated in the schematic cross section of FIG. 1, a rectangularly shaped sputtering pedestal electrode 12, which is typically electrically grounded, for holding a rectangular glass panel 14 or other substrate in opposition to a rectangular sputtering target assembly 16 within a vacuum chamber 18. The target assembly 16, at least the surface of which is composed of a metal to be sputtered, is vacuum sealed to the vacuum chamber 18 across an isolator 20. Typically, a target layer of the material to be sputtered is bonded to a backing plate in which cooling water channels are formed to cool the target assembly 16. A sputtering gas, typically argon, is supplied into the vacuum chamber 18 held at a pressure in the milliTorr range.

Advantageously, a back chamber 22 or magnet chamber is vacuum sealed to the back of the target assembly 16 and is vacuum pumped to a low pressure, thereby substantially eliminating the pressure differential across the target 16 and its backing plate. Thereby, the target assembly 16 can be made much thinner. When a negative DC bias is applied to the conductive target assembly 16 with respect to the pedestal electrode 12 or other grounded parts of the chamber such as wall shields, the argon is ionized into a plasma. The positive argon ions are attracted to the target assembly 16 and sputter metal atoms from the target layer. The metal atoms are partially directed to the panel 14 and deposit thereon a layer at least partially composed of the target metal. Metal oxide or nitride may be deposited in a process called reactive sputtering by additionally supplying oxygen or nitrogen into the chamber 18 during sputtering of the metal.

To increase the sputtering rate, a magnetron 24 is conventionally placed in back of the target assembly 16. If it has an inner magnetic pole 26 of one vertical magnetic polarity surrounded by an outer magnetic pole 28 of the opposite polarity to project a magnetic field within the chamber 18 and parallel to the front face of the target assembly 16, under the proper chamber conditions a high-density plasma loop is formed in the processing space adjacent the target layer. The two opposed magnetic poles 26, 28 are separated by a substantially constant gap defining the track of the plasma loop. The magnetic field from the magnetron 24 traps electrons and thereby increases the density of the plasma and as a result increases the sputtering rate of the target assembly 16. The relatively small widths of the linear magnetron 24 and of the gap produces a higher magnetic flux density. The closed shape of the magnetic field distribution along a single closed track prevents the plasma from leaking out the ends.

The size of the rectangular panels being sputter deposited is continuing to increase. One generation processes a panel having a size of 1.87 m×2.2 m and is called 40K because its total area is greater than 40,000 cm$^2$. A follow-on generation called 50K has a size of greater than 2 m on each side.

These very large sizes have imposed design problems in the magnetron since the target spans a large area and the magnetron is quite heavy but nonetheless the magnetron should be scanned over the entire area of the target and in close proximity to it.

Tepman addresses many of these problems in U.S. Patent Application Publication 2006/0049040, incorporated herein by reference. In the Tepman design a single large rectangular magnetron having a size only slightly smaller than that of the target is formed with a single inner magnetic pole surrounded by a single outer magnetic pole of the opposite polarity. The gap between them forms a long convolute path defining a closed plasma track adjacent the sputtering face of the target. The magnetron is scanned in a two-dimension pattern extending over dimensions much smaller than those of the magnetron or target. Specifically, the scanning dimension are approximately equal to the pitch between neighboring plasma tracks, thus providing a more uniform sputter erosion of the single continuous target and more uniform sputter deposition. Le et al. describe improvements to the Tepman apparatus and methods of operating it in U.S. patent application Ser. No. 11/484,333, filed Jul. 11, 2006, published as U.S. Published Patent Application 2007/0012562 and incorporated herein by reference.

However, the previously available magnetron sputter chambers for large flat panels have exhibited less than complete target utilization. In particular, the edge portions of the target adjacent the outer periphery of the scanned area of the magnetron are eroded more quickly than interior portions.

SUMMARY OF THE INVENTION

One aspect of the invention includes a magnetron having an outer magnetic pole surrounding an inner magnetic pole of the opposed magnetic polarity and separated from it by a gap forming a closed loop. When the magnetron is placed in back of a sputtering target in a plasma sputter chamber, the closed loop defines a plasma track on the sputtering face of the target. In this aspect, the loop has parallel straight portions joined by curved portions and the loop is folded once. The two ends of the loop may be located side by side on a same side of the target or more advantageously may meet in a middle area such that the loop curvature near the target side may be large.

Such a magnetron may be scanned both perpendicularly and parallel to the parallel portions.

Such magnetrons may be replicated and placed side by side. The replicated magnetrons may be simultaneously scanned over respective strip targets.

In another aspect of the invention, the magnets forming the magnetic poles may be reinforced in strength or number near the corners of the loop. Extra magnets may push the inside corners of the curves outwardly. Sharp curves may be formed with the inside poles having convex edges of greater than 180° joined to the straight portions by pairs of concave portions.

In a further aspect of the invention, multiple magnetrons may be separately supported, either fully or partially, on a support structure which is scanned in one or two dimensions so that the ganged magnetrons are together scanned horizontally. Each magnetron includes one closed gap between opposed magnetic poles to generate a close plasma track in the plasma chamber. The vertical support may be resilient and partial so that the multiple magnetrons can move independently in the vertical direction.

BRIEF DESCRIPTION OF THE DRAWINGS

FIG. 7 is a schematic plan view of two-level folded magnetron symmetric about is two ends.

FIG. 8 is a plan view of the two-level folded magnetron of FIG. 7 including the general distribution of cylindrical magnets.

DETAILED DESCRIPTION OF THE PREFERRED EMBODIMENTS

One embodiment of the source assembly of the invention separates both the target and the magnetron into associated strip targets and strip magnetrons. The strip targets are supported on a single target rack and the strip magnetrons are supported on a single scanned support plate so that magnetrons are ganged during their scan.

Another embodiment includes a magnetron suitable for use in a ganged magnetron assembly or other magnetron configuration.

Figure 2:
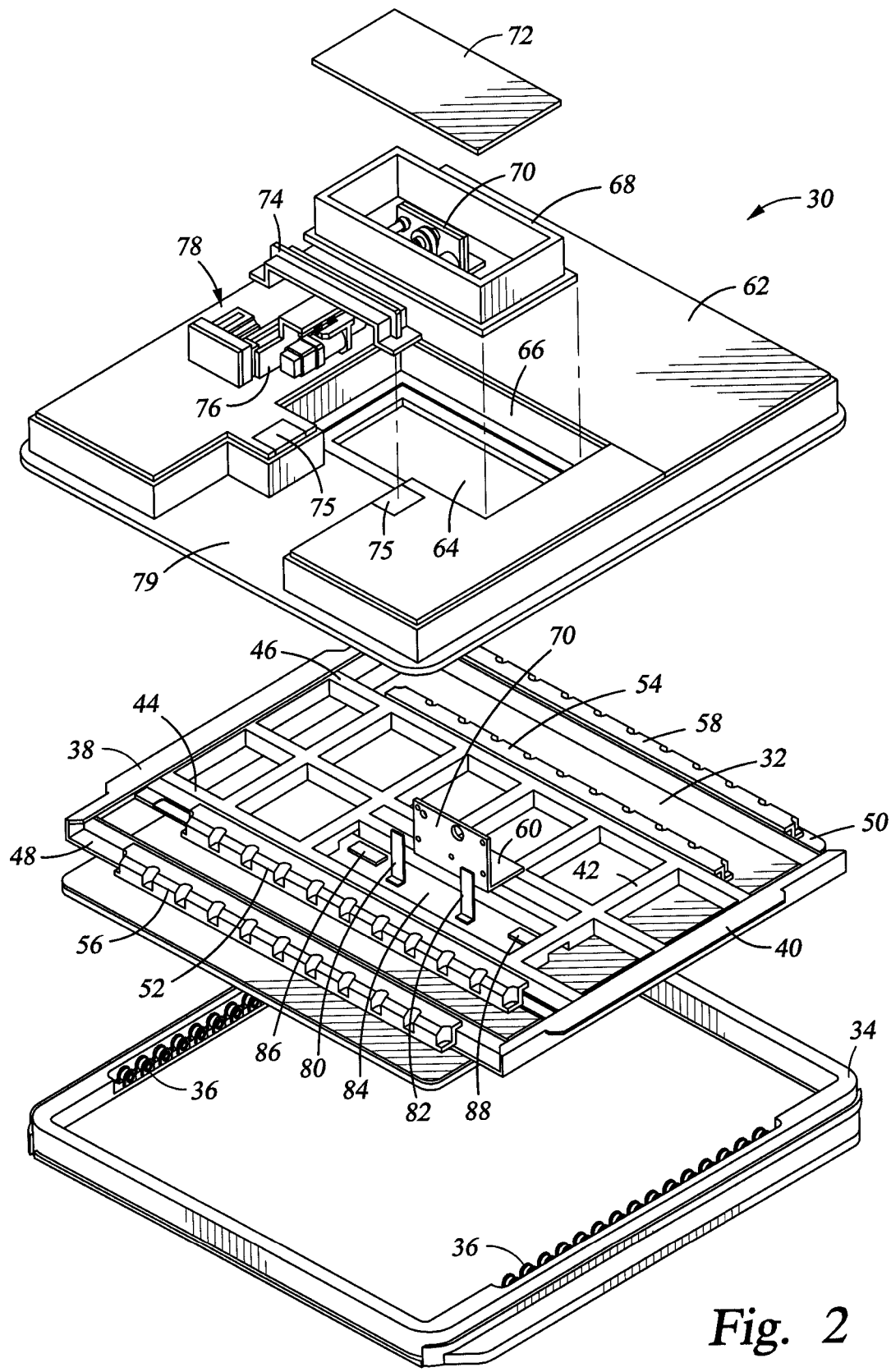
FIG. 2 is an orthographic view of a scan mechanism used for two dimensional scanning of a magnetron system.

A two-dimensional scan mechanism 30 illustrated in the orthographic view of FIG. 2 closely follows the scan mechanism described by Le et al. The published application 2007/0012562 should be consulted for yet more details. However, the scan mechanism 30 described herein supports a large support plate 32, preferably composed of non-magnetic material such as aluminum, which the scan mechanism 30 can scan in an arbitrary two-dimensional pattern. In contrast, the Tepman and Le apparatus scans a single magnetic yoke which rigidly supports and magnetically couples the entire magnetron assembly. The support plate 32 needs not be a sheet member but may be formed of multiple joined members forming a rigid support structure, which is movable by two perpendicularly arranged actuators. A frame 34 supported on the main chamber body 18 supports two rows of rollers 36 on opposed sides of the frame 34 to rollably support inverted frame rails 38, 40 supporting a gantry 42 between them. The gantry 42 includes four unillustrated rows of rollers on inner struts 44, 46 and outer struts 48, 50. The four struts rollably support inverted gantry inner rails 52, 54 and outer rails 56, 58. The gantry rails partially support the support plate 32 including partially suspended magnets on its lower side. The outer struts 48, 50 and outer rails 56, 58 are optional but provide additional support on the sides of the heavy support 34 to reduce the amount of droop near the edges. A bracket-shaped base plate 60 is fixed to the frame structure forming the gantry 42.

Figure 1:
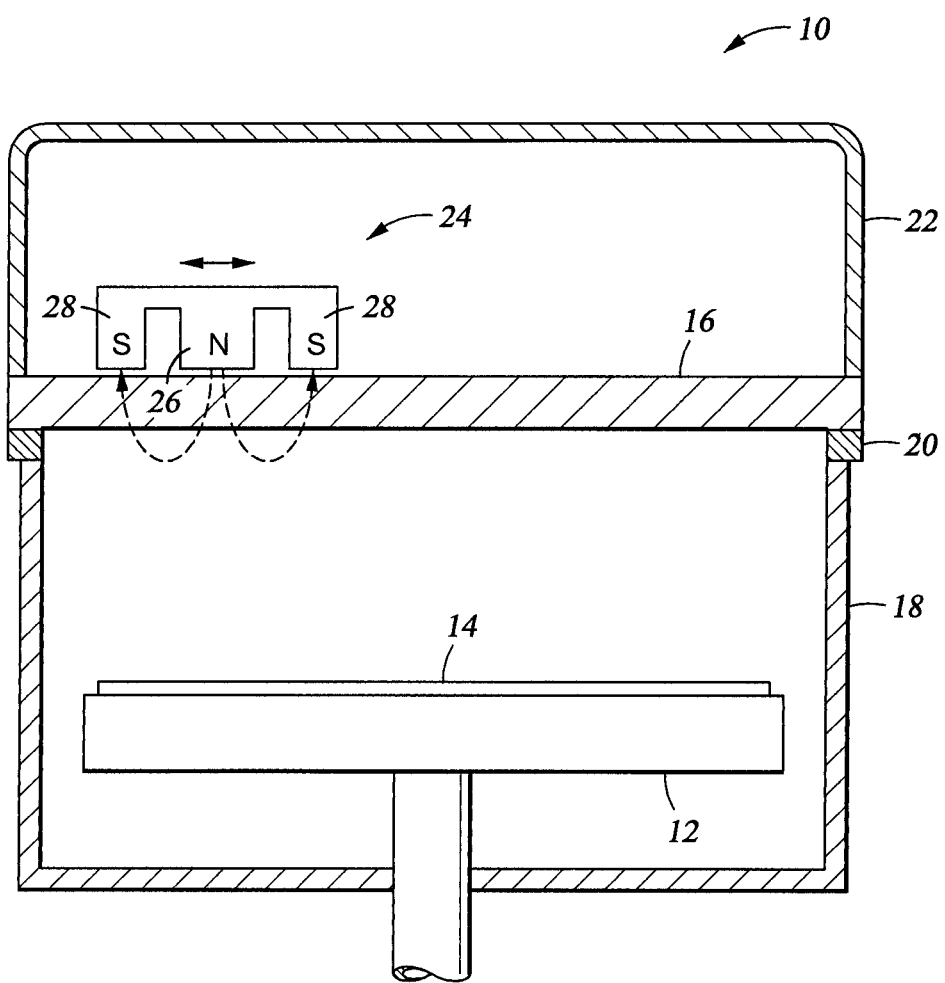
FIG. 1 is a schematic cross-sectional view of a sputter chamber adapted for sputtering onto large panels.

A magnet chamber roof 62, which forms the top wall of the back chamber 22 of FIG. 1, is supported on and sealed to the frame 34 with the gantry structure disposed between them and provides the vacuum wall over the top of the chamber accommodating the magnetron system. The magnet chamber roof 62 includes a rectangular aperture 64 and the bottom of a bracket recess 66. A bracket chamber 68 fits within the bracket recess 66 and is sealed to the chamber roof 62 around the rectangular aperture 64. A top plate 72 is sealed to the top of the bracket chamber 68 to complete the vacuum seal.

A gantry bracket 70 movably disposed within the bracket chamber 68 is fixed to the base plate 60 of the gantry 42. A support bracket 74, which is fixed to mounts 75 on the top of the magnet chamber roof 62, and an intermediate angle iron 76 holds an actuator assembly 78 in an actuator recess 79 in the magnet chamber roof 62 outside the vacuum seal. The support bracket 74 further acts as part of a truss system incorporated into the magnet chamber roof 62. The actuator assembly 78 is coupled to the interior of the bracket chamber 68 through two sealed vacuum ports.

The actuator assembly 78 including two independent actuators independently moves the gantry 42 in one direction by force applied through the gantry bracket 70 fixed to the gantry's base plate 60 and moves the support plate 32 in the perpendicular direction by a belt drive with a belt having wrapped around two unillustrated rollers affixed to stanchions 80, 82 on the support plate 32 and protruding upwardly through a gantry window 84. The ends of the belt are fixed to pedestals 86, 88 on the support plate 32.

Figure 3:
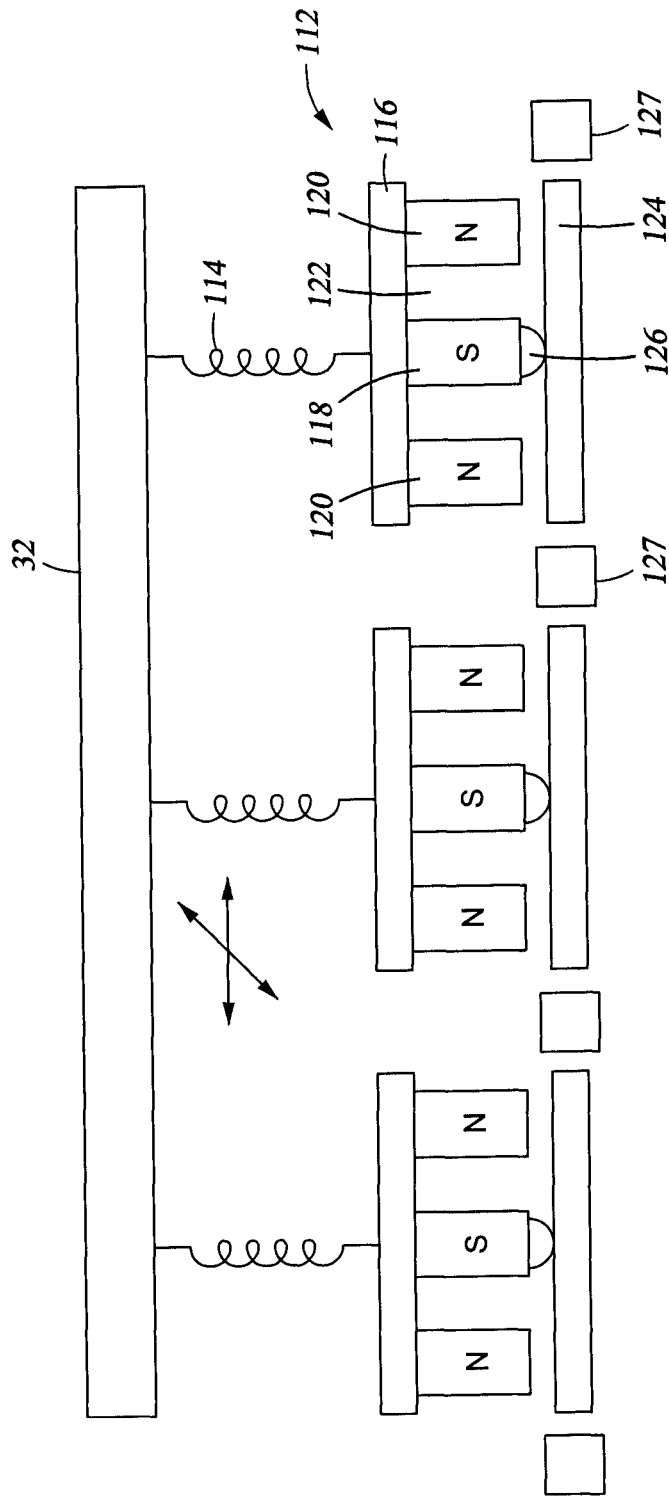
FIG. 3 is a schematic cross-sectional view of a ganged series of strip magnetrons each partially supported on an associated strip target.

As illustrated very schematically in the cross-sectional view of FIG. 3, the support plate 32 in turns partially supports each of multiple strip magnetrons 112 arranged in parallel through a respective spring mechanism 114. Each strip magneton 112 includes a respective strip magnetic yoke 116, which also acts as a back support plate for the strip magneton 112. The magnetic yoke 116 supports and magnetically couples an inner magnetic pole 118 of one magnetic polarity and an outer magnetic pole 120 of the opposed magnetic polarity surrounding the inner magnetic pole 118. A gap 122 between the two poles 118, 120 has a somewhat constant width and is formed along a closed path or loop. The illustrated structure of the poles 118, 120 and of the gap 122 is simpler than a preferred embodiment to be described later.

Each strip magnetron 112 is also partially supported on a respective strip target 124 through a roller ball 126 captured in a ball holder fixed to the magnetic yoke 116 or perhaps affixed thereto through intermediate structure. The roller ball 126 allows the strip magneton 112 to roll on the strip target 124 as the support plate 32 is scanned together with the strip magnetrons 112. Equivalent soft sliders may be substituted for the roller balls 126. There are typically more than one spring mechanism 114 and more than one roller ball 126 for each strip magnetron 112 to maintain the angular orientation of the strip magnetron 112, which is individually somewhat flexible. Preferably, the support plate 32 bears most of the magnetron weight but the resilience of the spring mechanism 114 allows each strip magneton 112 to follow any deformation in the strip target 124. Le et al. describe the partial support in Ser. No. 11/347,667, filed Feb. 2, 2006, and further details, particularly about making the yoke 116 to be more flexible, are described by Lavitsky et al. in the provisional application 60/835,680 and by Inagawa et al. in application Ser. No. 11/601,576, filed Nov. 17, 2006, all incorporated herein by reference. The strip targets 124 may be negatively biased to act as sputtering cathodes and may be surrounded by anodes 127, which are grounded or otherwise biased more positively than the strip targets 124 to excite a plasma adjacent the strip targets 124. RF biasing is also possible.

The ganged strip magnetrons can be scanned together by a single set of actuators so that they scan similar paths in parallel on the multiple strip targets. Nonetheless, the strip magnetrons are not directly mechanically linked together. The strip magnetrons may be separately fabricated and assembled to the support plate thus simplifying the use of an overall very large and heavy magnetron assembly. Also, the strip magnetrons may be separately vertically supported, for example, with independent spring supports. Similarly, separate vertical mechanical actuators may be used for the respective strip magnetrons. Further, the ganging allows a simple scan mechanism to scan multiple magnetrons over a target separated into portions separated by mechanical structure, such as anodes, which would interfere with a scanning a continuous magnetron.

Figure 4:
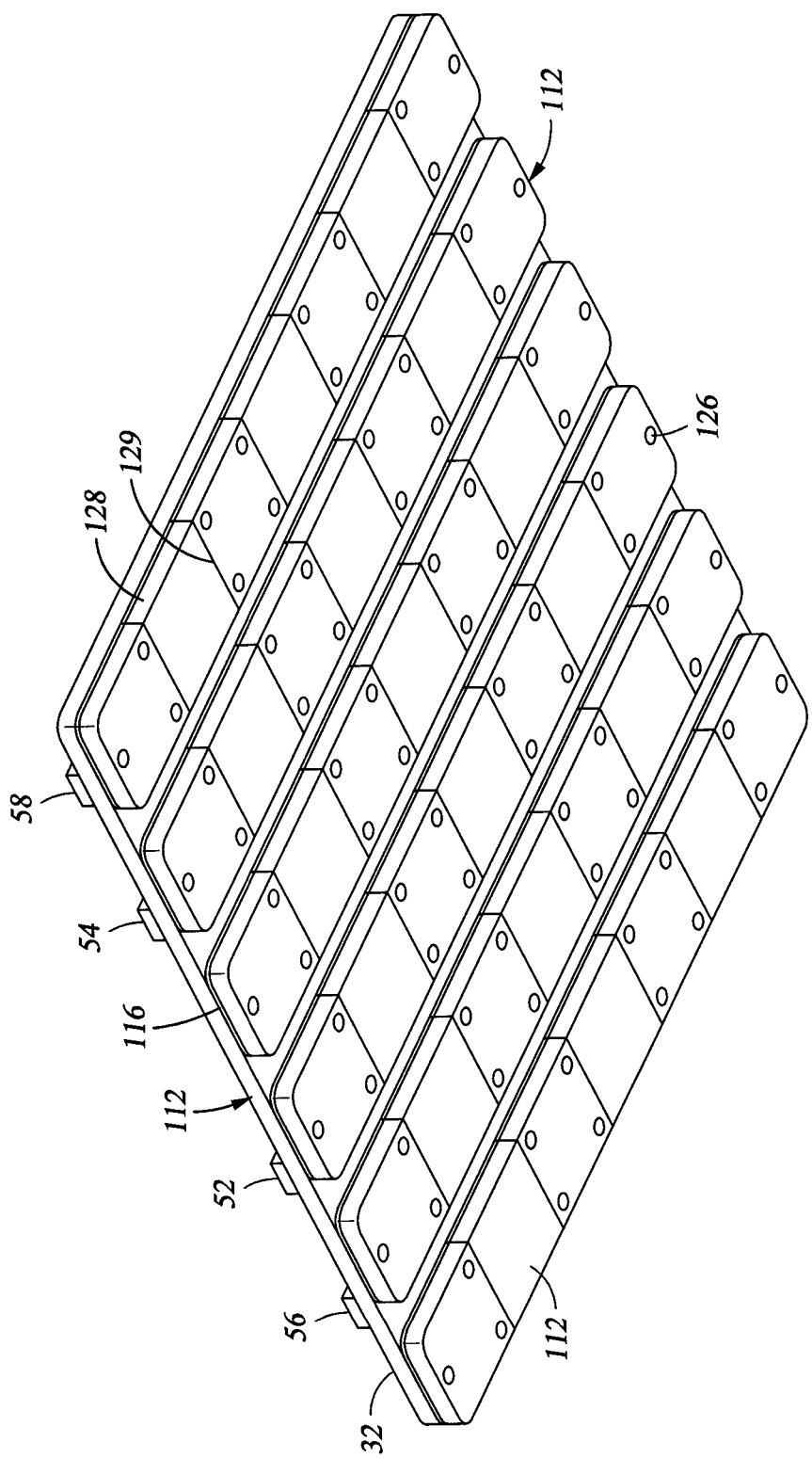
FIG. 4 is an orthographic bottom view of a the strip magnetrons constituting a magnetron system.

The magnets 118, 120 may be cylindrical magnets which are aligned with the respective yoke 116 by non-magnet retainers of the sort described in Ser. No. 11/484,333. The orthographic view of FIG. 4 generally from the bottom shows a multi-magnetron assembly resiliently suspended from the support plate 32, which itself is fixedly supported from the rails 52, 54, 56, 58. Each strip magnetron 112 is divided into retainer sections 128 with boundaries 129 between them, which are associated with respective ones of flexibly connected sections of the yoke plate 116, which generally underlie the boundaries 129 of the retainer sections 128 and are individually resiliently supported form the support plate 32. Roller balls 126 partially support the flexibly connected retainer sections 128 and associated yoke sections on the associated strip target 124. Thereby, the flexible magnetron can track and conform to a non-flat target.

Figure 5:
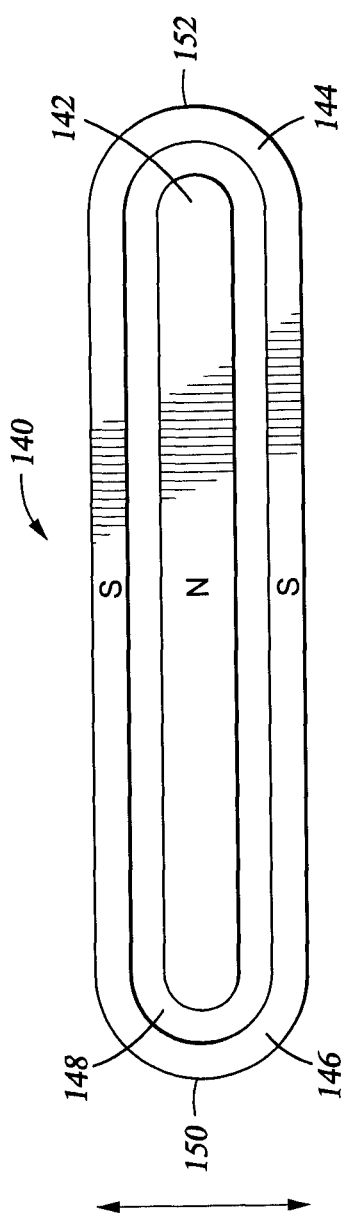
FIG. 5 is a plan view of conventional racetrack magnetron.

The simplified magnet distribution of FIG. 3 for each strip magnetron 112 corresponds to a well-known racetrack magnetron 140 illustrated in the plan view of FIG. 5. The racetrack magnetron 140 has a generally straight inner pole 142 is surrounded by an annular outer pole 144 of the opposite magnetic polarity with a nearly constant gap 148 between them. In practice, it is not necessary to cover the magnets with respective pole faces so that the magnet ends form the magnetic poles. The magnetron 140 extends along an axis from a head end 150 to a tail end 152 so that the gap 148 defining for the most part the plasma track it creates has two straight portions connected by 180° ends. However, the racetrack magnetron 140 disadvantageously produces hot spots in the sputter erosion patter near its head and tail ends 150, 152. The target utilization is determined by the hot spots since, once the hot spot of the target has been eroded through, the target must be replaced. We believe that the hot spots arise from the small radius of curvature at the ends 150, 152, which can be reduced by tailoring the magnetic field distribution there. Furthermore, however, the racetrack magnetron 140 is generally too narrow for the number and widths of strip targets and magnetrons being contemplated for sputtering onto 2 m panels. It is known to place multiple racetrack magnetrons next to each other with their long sides nearly abutting, but this does not eliminate the problem with hot spots.

Figure 6:
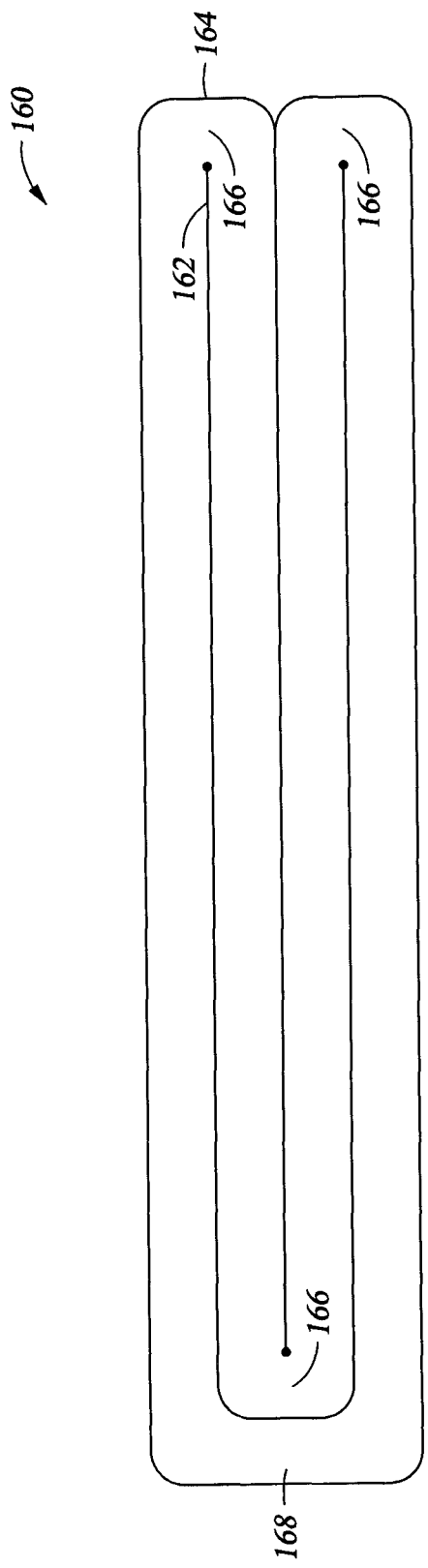
FIG. 6 is a schematic plan view of a two-level folded magnetron.

Serpentine magnetrons of the sort described by Tepman and Le can be accomplished by folding the racetrack magnetron into a serpentine pattern having parallel portions of the conventionally linearly arranged racetrack magnetron. For example, a two-level folded magnetron 160, schematically illustrated in the plan view of FIG. 6, is much less folded than Tepman's or Le's. It has an inner magnetic pole 162 of one polarity surrounded by an outer pole 164 of the other polarity with a gap in between. While the magnetron is wider, the gap and resulting plasma track now has three sharp 180° corners 166 at two different locations from the right and left edges, two of them close to the edge and the other somewhat further away from the other edge. Compensation close to the axis ends of the strip targets seems to present the greater problem. Further, a gentler 180° corner 168 on one side may require a different type of compensation. That is, the magnetic distribution is asymmetric from right to left as illustrated.

Another two-level folded magnetron 170, schematically illustrated in the plan view of FIG. 7, provides further advantages. It includes an inner pole 172 surrounded by an outer pole 174 of the opposite magnetic polarity with a gap in between. However, the head and tail of the serpentine loop meet at a joint 176 near the middle of the geometric ends of the generally linearly arranged narrow strip magnetron. There results four sharp 180° curves 178, all somewhat displaced from the right and left edges. In any case, the magnetic distribution can be made symmetric from the axial ends of the strip magnetrons and strip targets.

A more physical implementation of a two-level serpentine magnetron 180, as illustrated in bottom plan view in FIG. 8, includes a series of non-magnetic retainers 181, which are screwed into the yoke 116. The individual retainers are not shown, each of which are typically only a fraction of the axial length of the magnetron 180. More details of the retainers are found in the Tepman and Le patent applications. The retainers have cylindrical holes or facing serrated edges defining between them inner magnet positions 182 and outer magnet positions 184 with a non-magnetic gap 186 between them. Magnets of opposed polarities respectively are inserted into the inner and outer magnet positions 182, 184. Each of the sets of magnets is arranged in a nearly continuous distribution such that the inner magnet positions 182 define an inner magnetic pole of one polarity and the outer magnet positions 184 define an outer magnetic pole of the opposite polarity surrounding the inner magnet pole. In this embodiment, for the most part, the magnets are arranged in close-packed double rows in the interior of the magnetron but in a single row at the periphery of the magnetron. The gap 186 between the inner and outer magnetic poles has a nearly constant width and is formed in a closed shape or loop which corresponds generally to the plasma track the magnetron creates on the sputtering face of the target. However, the retainers may provide extra magnet positions inside or outside of the rows, especially around the corners, to tailor the magnetic field distribution and intensity.

This first-order design, however, tends to exhibits exterior hot spots 190 and an interior hot spot 192. We believe both types of hot spots 190, 192 arise from sharp ends 193a, 193b, 194a, 194b of the inner and outer poles and the acute corners in the plasma track associated with them. For a variety of reasons, the plasma track tends to swerve towards the sharp ends 193a, 193b, 194a, 194b and to have a higher current density producing a higher plasma density and hence higher sputtering rate.

One reason for the lateral movement of the electrical current in the plasma is the imbalance o f the magnets around the corners of high curvature since the first-order design includes single row of oppositely polarized magnets dedicated to each segment of the plasma track and placed on either side of the gap. That is, the exterior line of magnets are in a single row and all interior lines of magnets are in double rows. The first-order design of FIG. 8 produces a double-row joint 196 between the head and the tail of the folded serpentine magnet. Adjacent the sharp corners, there may be significantly fewer magnets of one polarity associated with the sharp ends 193a, 193b, 194a, 194b at the convex side of the curving gap than magnets of the opposite polarity disposed on the outside curved edge at the concave side of the curving gap. The magnetic imbalance tends to push the plasma track towards the sharp ends 193a, 193b, 194a, 194b. This shift of the centerline of the plasma track may be explained by understanding that the track centerline tends to occur where the magnetic field in front of the sputter target is horizontal, that is, parallel to the target. When one magnetic pole is weaker than the other magnetic pole, the flat portion of the magnetic field distribution is pushed towards the weaker pole.

Figure 9:
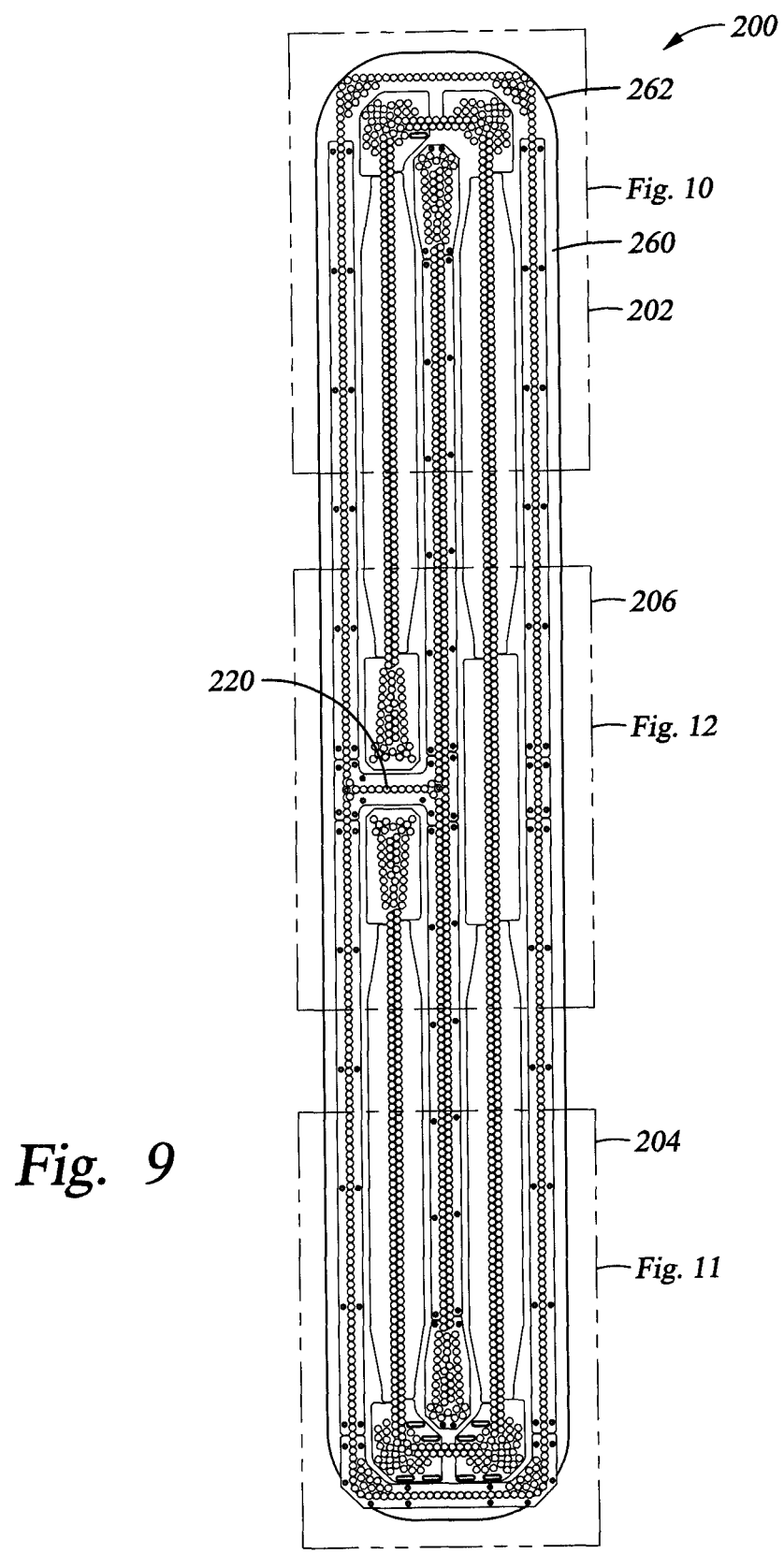
FIG. 9 is plan view of an improved two-level folded magnetron showing retainers and tailored distribution of magnets around the corners of the plasma track.

An improved two-level serpentine magnetron 200 is illustrated in the bottom plan view of FIG. 9. Its complementary end sections 202, 204 are illustrated in more details in FIGS. 10 and 11 and its middle section 206 in FIG. 12. Straight and corner retainers may be designed with sizes and shapes such that the number of unique retainers is minimized. As before, straight interior retainers 208, 210 with serrated edges define between them a staggered double row of magnet positions 212 on the interior. However, edge clearance is reduced in the target assembly including anodes and possibly stiffening struts between target strips so that exterior straight retainers 214 are integral from one lateral side to the other and cylindrical magnet holes 216 are bored through them in a single row. These figures do not accurately represent the magnet holes 216 in the exterior straight retainers 214 since no continuity in the retainers 214 is apparent from one side to the other of the magnet holes 216. These figures also do not illustrate the roller balls between and often intruding into the retainers.

Figure 12:
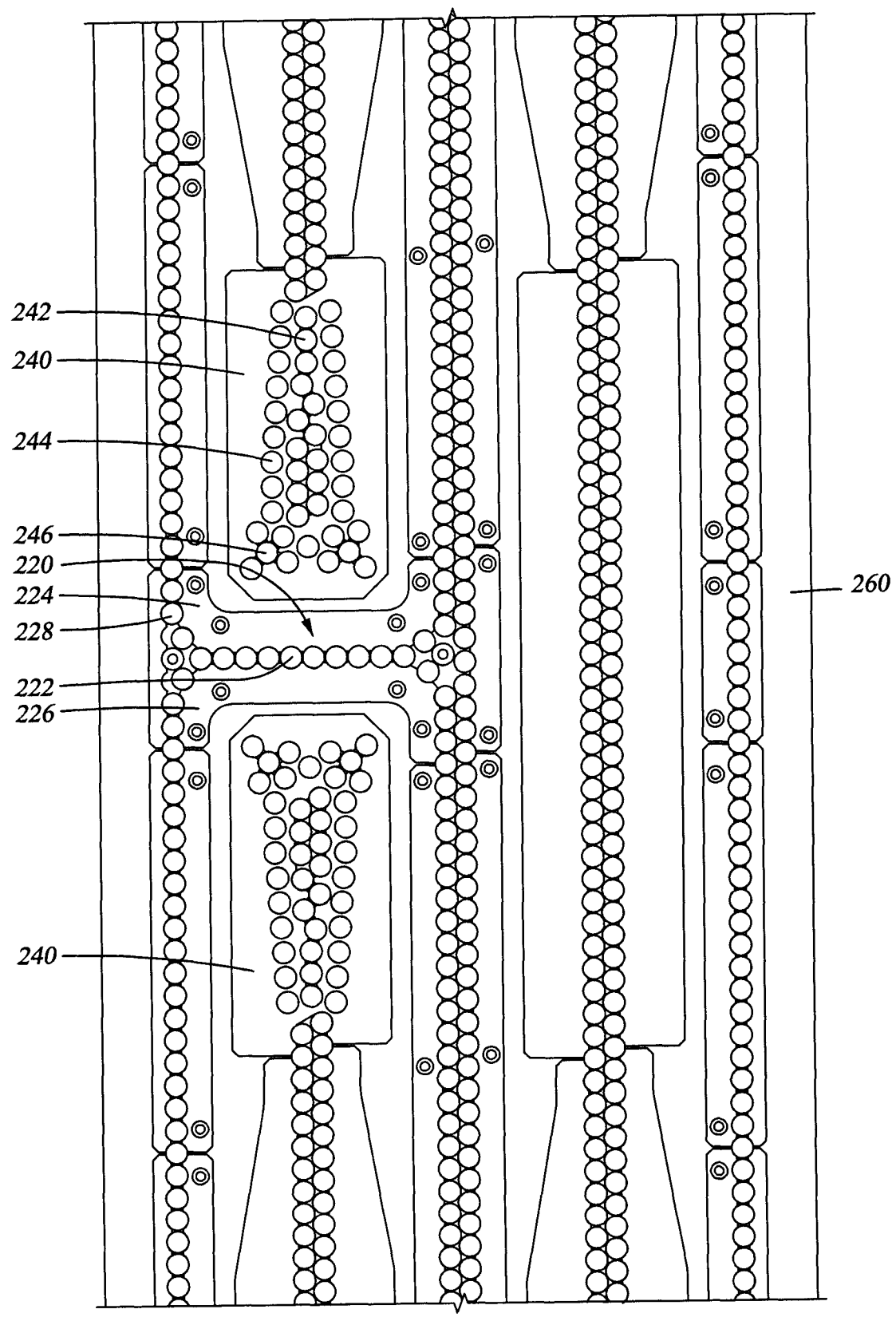
FIG. 12 is a detailed view of the middle section of the two-level folded magnetron of FIG. 9.

One method of improving the erosion uniformity is to remove one row of magnets from the joint 196 of FIG. 8. As illustrated in FIGS. 9 and 12, a single-row joint 220 is formed by a single row of magnet positions 222 formed between the serrated edges of two joint retainers 224, 226, which also contains bored holes 228 for the single external row of magnets.

The corner effects arise at least partially by a change of magnetic field at the corners. It is desirable to maintain the magnetic field intensity at the corners to closely approximate that in the straight sections. One method of equalizing the magnetic fields in the curving geometry is to vary the strength of the individual magnets. For example, most magnets have a moderate strength, for example, indicated by the designation N38. However, some of the magnet positions are occupied by stronger and more expensive magnets, for example, indicated by the designation N48.

Figure 10:
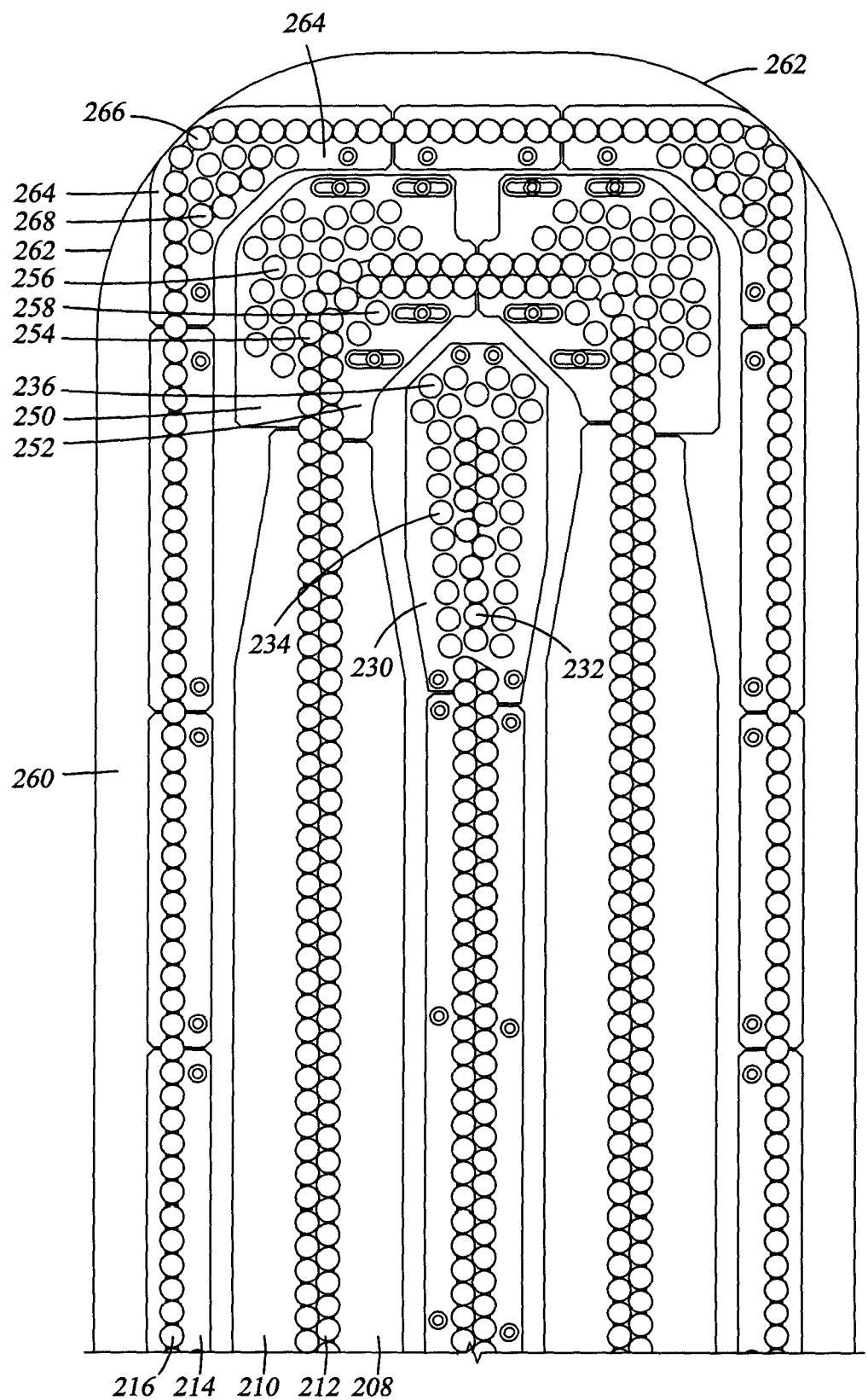
FIGS. 10 and 11 are detailed views of the two ends of the two-level folded magnetron of FIG. 9.
Figure 11:
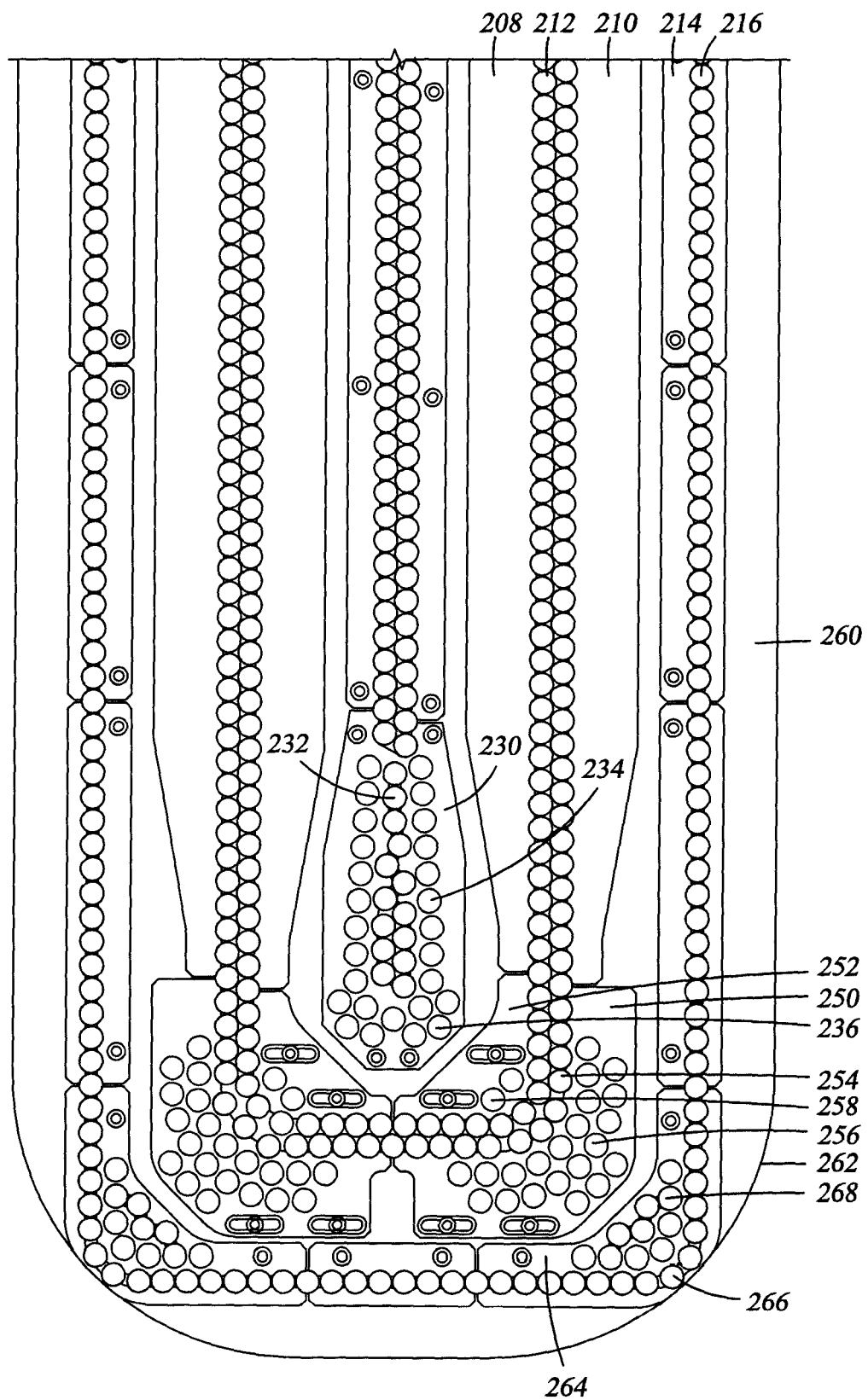

As illustrated in FIGS. 10 and 11, in one embodiment, tear-drop retainers 230 used at the interior 180° sharp corners have interior magnet positions 232 which are filled with N48 magnets. Regular magnet positions 234 are flared somewhat outwardly from the interior magnet positions 232. Exterior magnet positions 236 are flared even further out at the tip of the tear-drop retainer 230. In different embodiments, some or all of the regular and exterior magnet positions 234, 236 are filled or left empty. The strength of these latter magnets may also be varied.

As shown in FIG. 12, similar tear-drop retainers 240, their tear-drop shape being defined by the magnet positions, are used at the middle 180° sharp corners adjacent the joint 220. They too have interior magnet positions 242, regular magnet positions 244 at flared out positions, and exterior magnet positions 246 flared out even further at the tip.

An alternative approach is to increase the radius of the plasma track adjacent the 180° sharp corners. This can be accomplished by removing the magnets from the interior magnet positions 232, 242 and populating the flared regular positions 234, 244 or further flared exterior positions 236, 246. The effect of the tear-drop shape is provide a smooth flare-out and flare-in of the inner magnets and hence the plasma track to reduce an sharp curvature. This gradual flaring contrasts with the use of conventional T-bar ends of the inner pole which reduces the curvature on the exterior tip at the expense of increased curvature entering the tee. The flaring produces a convex portion of the plasma track at the corner of greater than 180° and a pair concave portions compensating for the convexity and connecting to the straight portion of the plasma track. Even though the sum of the magnitudes of the curvature around the 180° corner is greater than 180° because of the combination of convex and concave portions, the total curvature of positive and negative curvatures of the flared corner is approximately 180°. The concave portions may be characterized as containing at least three magnets aligned along a curve.

As shown in FIGS. 10 and 11, radially outer interior corner retainers 250 have serrated edges forming together with radially inner interior corner retainers 252 defining a curved staggered double row of regular magnet positions 254. However, additional magnet holes 256 are bored in the radially outer interior corner retainers 250 to allow the use of replacement or additional magnets to push the plasma track radially outwardly. Further, additional magnet holes 258 bored in the radially inner interior corner retainer 252 allow tailoring of the magnetic field.

The magnetron 200 may be juxtaposed to a strip target 260 having curved corner 262 and scanned short distances with respect to it. To prevent selective redeposition at portions of the strip target 260 outside of the plasma track at the curved corners 262, it is desirable to shape the plasma track to have a curvature nearly equal to that of the targets curved corners 262. Accordingly, integral exterior corner retainers 264 are drilled with a single row of regular magnet holes 266 as well as a number of radially inward extra magnet holes 268. The plasma track can be pulled radially inwardly to conform to the target's curved corner 262 by depopulating the regular magnet holes 266 and populating some or all of the extra magnet holes 268. The extra magnet holes, which may be selectively populated, allow for a linear magnetic density to vary along the length of the plasma track and the two magnetic poles sandwiching the gap defining the plasma track.

Figure 13:
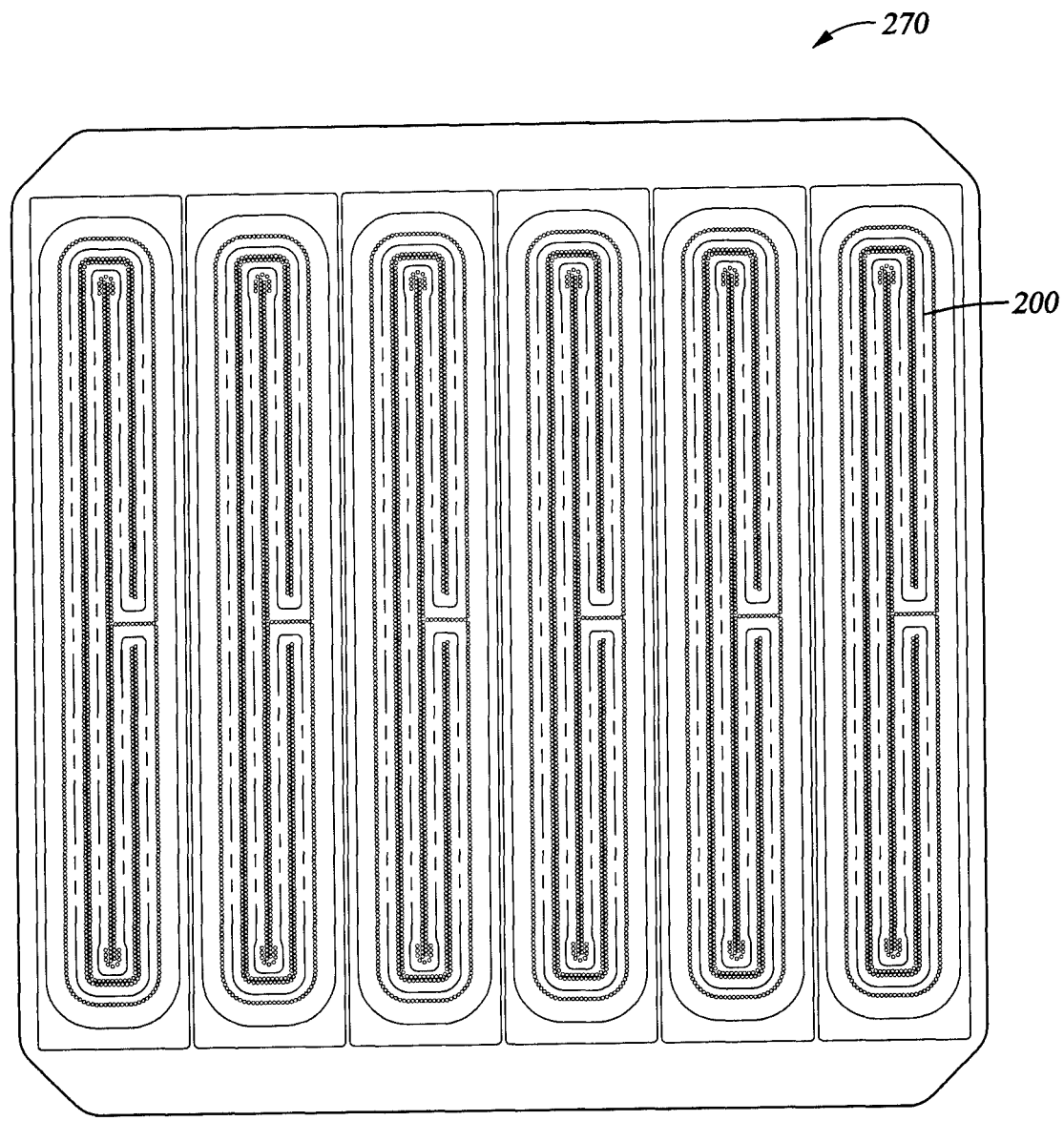
FIG. 13 is a plan view a magnetron system of multiple strip magnetrons each of the form of the two-level folded magnetron of FIG. 9.

A target assembly 270 illustrated in the plan view of FIG. 13 includes six strip magnetrons 200 associated with six strip targets 260 and arranged in parallel. Each strip magnetron 200 may have the features described above. The strip magnetron 200 are preferably not magnetically coupled between them and may be separately supported, optionally resiliently supported on a common rigid support structure which is scanned in the desired pattern.

The techniques described above may be applied to other magnetrons than the two-level folded magnetron. In particular, the single racetrack magnetron may benefit from adjusting the plasma track curvature and magnetic field strength adjacent its two sharp ends. Further, multiple single racetrack magnetrons can be ganged by being supported on a single support plate and to be resiliently and partially supported and roll on and follow the contour of one or more targets. Although the described embodiments included cylindrical magnets having axes perpendicular to a sputtering face of the targets, the various aspects of the invention can be applied to magnetrons in which the opposed magnets are inclined at less than 45° toward the center of the gap separating the two poles.

Figure 14:
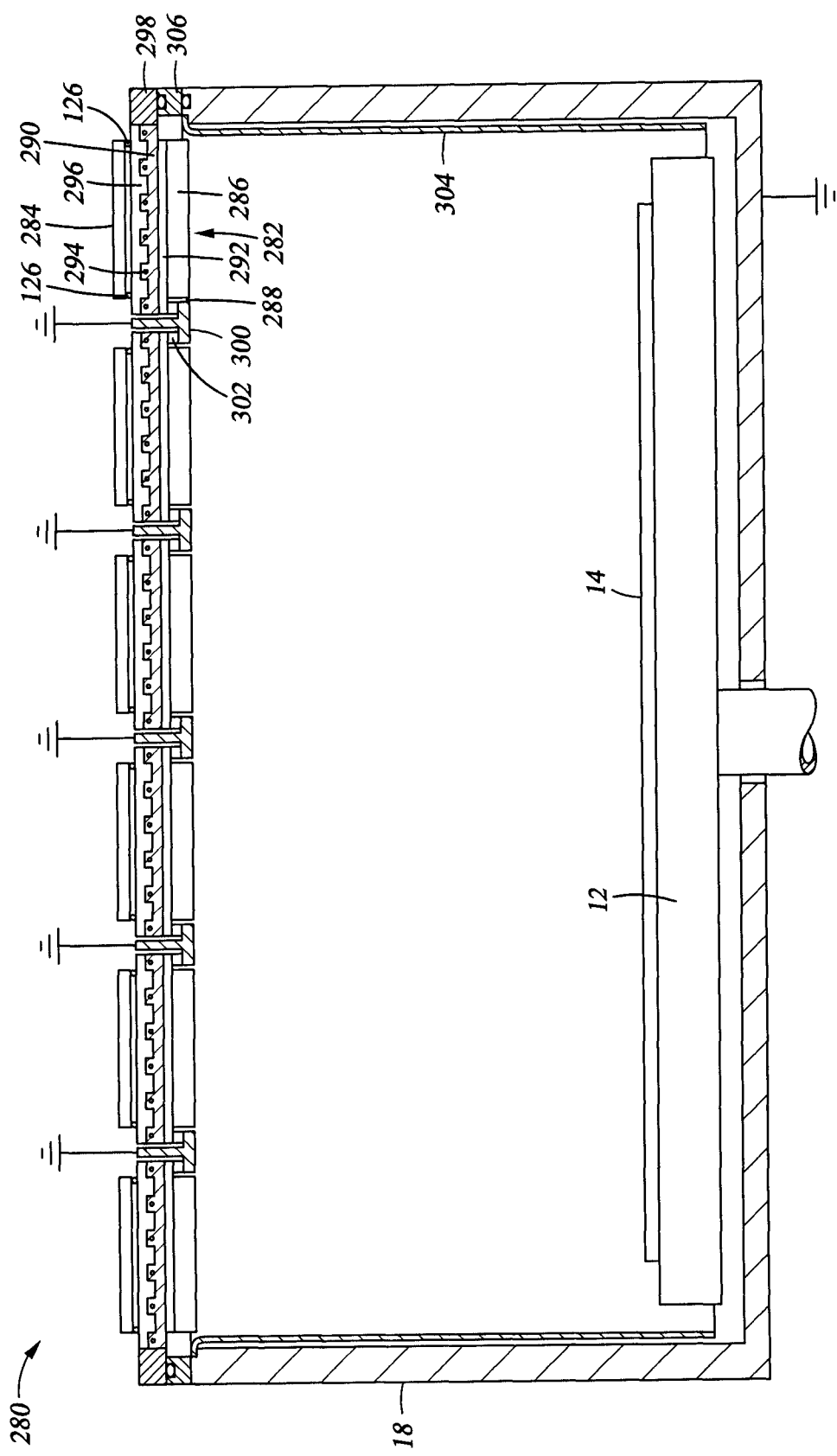
FIG. 14 is a schematic cross-sectional view of a sputtering source including multiple strip targets and associated strip magnetrons.

A sputtering chamber 280 illustrated in the cross-sectional view of FIG. 14 includes multiple strip targets 282 and associated strip magnetrons 284. Both the strip targets 282 and strip magnetrons 284 benefit from the inventive features described above. The spring mechanisms 114 partially supporting the magnetrons 284 on the support plate 32 are not illustrated. Each strip target 282 includes a target layer 286 having axially extending side indented borders 288 corresponding to the plasma dark space. The target layer 286 of each strip target 282 is bonded to a strip backing plate 290 through a bonding layer 292 of approximately the same horizontal extent as the strip target layer 286. The strip backing plate 290 is formed with ridges through which cooling channels 294 are bored. A light-weight filling material layer 296, which may be a dielectric, fills the valleys between the ridges and is planarized above the ridges to form a flat surface on which the roller balls 126 of the strip magnetrons 284 roll. The strip targets 282 are fixedly supported on the chamber 18 by an unillustrated mechanical structure including an apertured rack 298 supporting peripheries of the strip backing plates 290. The strip targets 282 are electrically powered to excite the plasma of the sputter working gas.

The strip targets 282 advantageously allow axially extending grounded anodes 300 to protrude to the sputtering surface of the target while held within the gaps formed by the indented borders 288 between two neighboring strip targets 282. The grounded anodes 300 are electrically isolated from the strip backing plate 290 by an insulator 302, which may be formed from an extension of the filling material layer 296, and may also provide a vacuum seal between the high-vacuum sputtering chamber 18 and the low-vacuum back chamber 22. The strip targets 282, on the other hand, are electrically powered and are isolated from the anodes 300 by the insulators 302 and other vacuum gaps smaller than the plasma dark space to act as cathodes in generating the sputtering plasma. The sputter chamber 280 additionally includes an electrically grounded shield 304 to protect the chamber sidewalls from deposition while also acting as an anode on the sides. An isolator 306 electrically isolates the chamber 18 from the rack 298 and the strip backing plates 290 it supports. However, the electrical isolation may alternatively be provided between the rack 298 and each of the different strip targets 282 it supports. The ganged scanning of multiple magnetrons is applicable to the single racetrack magnetrons of FIG. 5, the simple two-level folded magnetron of FIG. 6, the center-joint two-level magnetrons of FIGS. 7-11 as well as to more complex magnetrons.

The support plate 32 is scanned in a pattern so that all the magnetrons 284 are scanned in substantial synchronism in the same pattern. The principal variation between the magnetrons' paths arise from the resilience of their support on the support plate. The scanned patterned may extend along one or the other or both of the orthogonal x- and y-axes, or be a two-dimensional x-y scan pattern, for example, an O-shaped pattern having portions extending along the x- and y-axes, an X-shaped pattern having portions extending along two diagonals, a Z-shaped pattern extending along opposed parallel sides and a diagonal therebetween, or other complex patterns. Only a single scan mechanism is required for the multiple supported magnetrons although, of course, plural sets of multiple magnetrons and associated scan mechanisms are possible.

It must be emphasized that some aspects of the invention are not limited to the two-level serpentine magnetron or to separately and resiliently supported magnetrons.

The various aspects of the invention may be used to provide more uniform sputtering and more complete target utilization.

The invention claimed is:

1. A two-level folded magnetron including an outer magnetic pole of one polarity surrounding an inner magnetic pole of another polarity at least partially opposed to the one polarity and separated therefrom by a gap extending in a closed path, the path including two generally parallel sub-paths each extending from a head to a tail thereof along a respective folded pattern including a first straight portion extending form the head to a first 180° corner, a second straight portion extending from the first 180° corner to a second 180° corner, and a third straight portion extending from the second 180° corner to the tail, both the first and third straight portions of each of the two sub-paths extending along a respective axis common to the first and third straight portions and parallel to the corresponding second straight portion, wherein the head comprises a third 180° corner linking and extending between ends of the two respective first straight portions of the two sub-paths and the tail comprises a fourth 180° corner linking and extending between ends of the two respective third straight portions of the two sub-paths.

2. The magnetron of claim 1, wherein the inner pole includes a straight portion and an acute portion and wherein at least one of the 180° corners includes a tear-drop shape which flares outwardly from a tip of the acute portion and thereafter flares inwardly toward two of the straight portions, wherein the tear-drop shape reduces hot spots at the acute portion.

3. The magnetron of claim 2, wherein interior portions of the tear-drop shape are not populated with magnets but peripheral portions of the tear-drop shape are populated with magnets.

4. The magnetron of claim 1, wherein a linear density of magnetic strength in the outer pole one pole adjacent one of the 180° corners is greater than a linear density of magnetic strength of the inner pole adjacent the one 180° corner.

5. The magnetron of claim 1, further including means to move a centerline of a resultant plasma track from a convex portion of the gap towards a concave portion of the gap.

6. A magnetron assembly comprising:
a plurality of the two-level folded magnetrons of claim 1;
a movable rigid support structure supporting the plurality of the two-level folded magnetrons; and respective resilient supports between the support structure and the plurality of the two-level folded magnetrons to partially support respective ones of each of the two-level folded magnetrons.

7. The magnetron of claim 6, wherein the resilient supports comprise respective tension springs partially and resiliently supporting respective ones of the two-level folded magnetrons.

8. The magnetron of claim 1, wherein first ones of the first and second straight portions of the two sub-paths extend along a first axis and second ones of the first and second straight portions of the two sub-paths extend along a second axis parallel to but displaced from the first axis, whereby the head and tail are adjacent each other.

9. The magnetron of claim 1, wherein the third 180° corner extends between ends of the two respective first straight portions of the two sub-paths to thereby link the two respective straight portions of the two sub-paths and the fourth 180° corner extends between ends of the two respective third straight portions of the two sub-paths to thereby link the two respective straight portions of the two sub-paths.

10. A magnetron including an outer magnetic pole of one polarity surrounding an inner magnetic pole of an at least partially opposed polarity and separated therefrom by a gap extending in a closed path including a gap corner between a convex corner of one pole and a concave corner of the other pole, further comprising magnets of a first magnetic strength defining each of a plurality of straight portions of the two poles and magnets of a second and stronger magnetic strength at least partially defining the convex corner.

11. The magnetron of claim 10, wherein the magnets of the first magnetic strength define the concave corner.

12. A magnetron, comprising first magnets of a first magnetic polarity and second magnets of a second magnetic polarity at least partially opposed to the first magnetic polarity and surrounding the first magnets and separated therefrom by a gap arranged in a closed pattern having parallel straight portions connected by curved portions, wherein the first and second magnets are arranged substantially uniformly in the straight portions and are arranged in non-uniform arrangement in the curved portions compared to a uniform arrangement having one or two rows of magnets arranged along sides of the gap.

13. The magnetron of claim 12, wherein in the curved portions more magnets are arranged on a convex side of the gap than on the concave side compared to an arrangement having one or two rows of magnets arranged alongside the gap.

14. A ganged magnetron, comprising:
a movable rigid support structure;
a plurality of magnetic plates disposed below the support structure and separately, resiliently, and partially supported from above by the support structure; and
a plurality of magnet arrangements having a closed path formed between magnetic poles of opposite polarities and separately supported by respective ones of the magnetic plates, wherein each of the magnet arrangements comprises a two-level folded magnetron including an outer magnetic pole of one polarity surrounding an inner magnetic pole of another polarity at least partially opposed to the one polarity and separated therefrom by a gap extending in a closed path, the path including two generally parallel sub-paths each extending from a head to a tail thereof along a respective folded pattern each including a first straight portion extending from the head to a first 180° corner, a second straight portion extending from the first 180° corner to a second 180° corner, and a third straight portion extending from the second 180° corner to the tail, both the first and third straight portions of each of the two sub-paths extending along a respective axis common to the first and third straight portions and parallel to the corresponding second straight portion, wherein the head comprises a third 180° corner linking the two first straight portions of the two sub-paths and the tail comprises a fourth 180° corner linking and extending between ends of the two straight portions of the two sub-paths.

* * * * *